(12) United States Patent
Lou

(10) Patent No.: US 6,271,116 B1
(45) Date of Patent: Aug. 7, 2001

(54) METHOD OF FABRICATING INTERCONNECTS

(75) Inventor: Chine-Gie Lou, Hsinchu Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/528,645

(22) Filed: Mar. 20, 2000

(30) Foreign Application Priority Data

Jan. 13, 2000 (TW) .................................................. 89100466

(51) Int. Cl.[7] .............................................. H01L 21/4763
(52) U.S. Cl. ......................... 438/623; 438/622; 438/624; 438/637; 438/688; 438/700; 438/780; 438/782
(58) Field of Search ..................................... 438/622–624, 438/631, 633, 636–640, 700, 735–740, 780, 782, 688, 675, 672

(56) References Cited

U.S. PATENT DOCUMENTS 5,476,817 * 12/1995 Numata ................................. 437/195
5,675,187 * 10/1997 Numata et al. ....................... 257/758
5,858,869 * 1/1999 Chen et al. ........................... 438/597
6,165,893 * 12/2000 Chung ................................... 438/623

FOREIGN PATENT DOCUMENTS

6326431 * 11/1994 (JP) .
101999882 * 7/1998 (JP) .

* cited by examiner

Primary Examiner—Chandra Chaudhari
Assistant Examiner—Thanhha Pham
(74) Attorney, Agent, or Firm—Jiawei Huang; J.C. Patents

(57) ABSTRACT

A method for fabricating interconnects is described. A semiconductor substrate having metal lines is provided. A liner layer is formed over the substrate, and then a dielectric layer is formed between the metal lines, wherein the dielectric layer has a low dielectric constant. Patterned thermal conductivity layers are formed surrounding the predetermined regions of vias. Thereafter, another dielectric layer with low dielectric constant is formed between the patterned thermal conductivity layers, and then a planar cap layer is formed over the substrate. Via openings exposing the metal lines are formed in the planar cap layer, the patterned thermal conductivity layer and the liner layer. A metal material is filled in the via openings to form vias.

18 Claims, 2 Drawing Sheets

METHOD OF FABRICATING INTERCONNECTS

CROSS-REFERENCE TO RELATED APPLICATION

This application claims the priority benefit of Taiwan application Ser. No. 89100466, filed Jan. 13, 2000.

BACKGROUND OF THE INVENTION

1. Field of the Invention

The invention relates to a method of fabricating a multi-level interconnect process, and particularly relates to a method of fabricating a metal interconnect process used for avoiding poisoned vias.

2. Description of the Related Art

In integration circuit process for semiconductor devices, the interconnects are provided between two devices to allow electrical connection. The present metal interconnect comprises multilevel metal layer to connect the devices in the circuit, since the density of integrated circuits has increased and the function has become more complicated.

The inter-metal dielectric layer (IMD) is used for isolating an upper metal layer and a lower metal layer. The upper and lower metal layers are connected by vias.

In the conventional multilevel interconnect process, an inter-metal dielectric layer is formed to cover a substrate having metal lines thereon. Thereafter, via openings are formed in the inter-metal dielectric layer by photolithography and etching, and then the via openings are filled with a metal plug layer to form vias. Other metal deposition processes, photolithography and etching are performed.

Organic polymer material that has a dielectric constant lower than the dielectric constant of silicon oxide is used as the inter-metal dielectric layer in deep sub-micron processes, in order to increase the device performance and reduce the resistance-capacitance time delay effect.

However, the organic polymer material that has a low dielectric constant is damaged while the photoresist is being removed by oxygen plasma. In the above method of fabricating the metal interconnects, after the via openings are formed by etching the inter-metal dielectric layer composed of the organic polymer material, the organic polymer material exposed by the sidewall of the via openings is damaged.

SUMMARY OF THE INVENTION

The present invention is a method of fabricating interconnects. A semiconductor substrate having metal lines is provided. A liner layer is formed over the substrate, and then a dielectric layer is formed between the metal lines, wherein the dielectric layer has a low dielectric constant (k). Patterned thermal conductivity layers are formed surrounding the predetermined regions of vias. Thereafter, another dielectric layer with low dielectric constant is formed between the patterned thermal conductivity layers, and then a planar cap layer is formed over the substrate. Via openings exposing the metal lines are formed in the planar cap layer, the patterned thermal conductivity layer and the liner layer. The via openings are filled with a metal material to form vias.

In one preferred embodiment of the method of the present invention, an inter-metal dielectric layer comprises four layers, which includes the liner layer, the dielectric layer, the thermal conductivity layer and the cap layer. The material of the dielectric layers is an organic material with low dielectric constant, the material of the thermal conductivity layer is an inorganic material with low dielectric constant and high thermal conductivity.

Since the inter-metal dielectric layer is formed by a great number of low dielectric constant materials, the resistance-capacitance time delay effect is reduced and the performance of the device is improved.

The vias and the low dielectric constant organic dielectric layers are surrounded with the thermal conductivity layer, the cap layer formed with silicon oxide and the liner layer formed with silicon oxide. The organic dielectric layers with low dielectric constant are not exposed by the via openings. The inter-metal dielectric layer on the sidewalls of the via openings is not damaged while removing a photoresist layer used for defining the via openings by oxygen plasma. The issue a poisoned via is avoided while filling the via openings with metal material.

The thermal conductivity layer is patterned to form dummy lines which are located surrounding the predetermined regions of the vias. The thermal conductivity layer has high thermal conductivity, so that the heat produced by the metal lines under high speed operation can be diffused. Therefore, the present invention can avoid the reliability problem arising from using the organic dielectric material.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
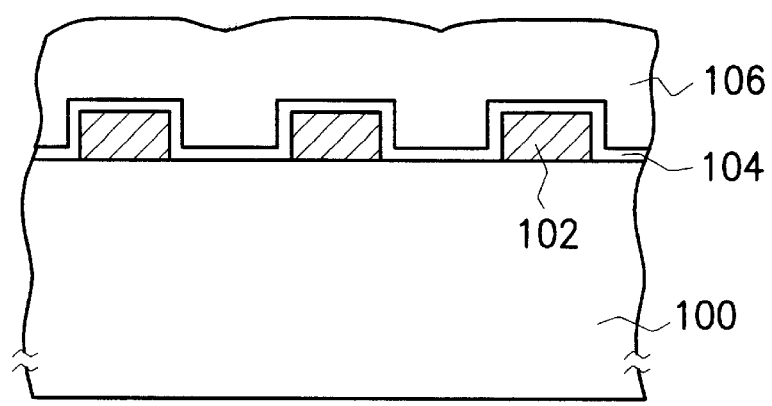
FIGS. 1A–1F are schematic, cross-sectional views illustrating a method of fabricating interconnects according to preferred embodiment of the method of the present invention.

Referring to FIG. 1A, a substrate 100 having metal lines 102 formed thereon is provided. The material of the metal lines 102 comprises aluminum copper alloy or aluminum silicon copper alloy, for example.

Thereafter, a liner layer 104 is formed to cover the metal lines 102. A material of the liner layer 104 comprises silicon oxide formed by, for example, chemical vapor deposition. A dielectric layer 106 is formed on the liner layer 104. The dielectric layer 106 has a low dielectric constant which is less than 3. A material of the dielectric layer 106 comprises spin-on organic material, for example, fluorinated polyimide (FPI), polyarylene ether (PAE), polymer or fluorinated poly(arylethers) (FLARE).

Figure 1B:
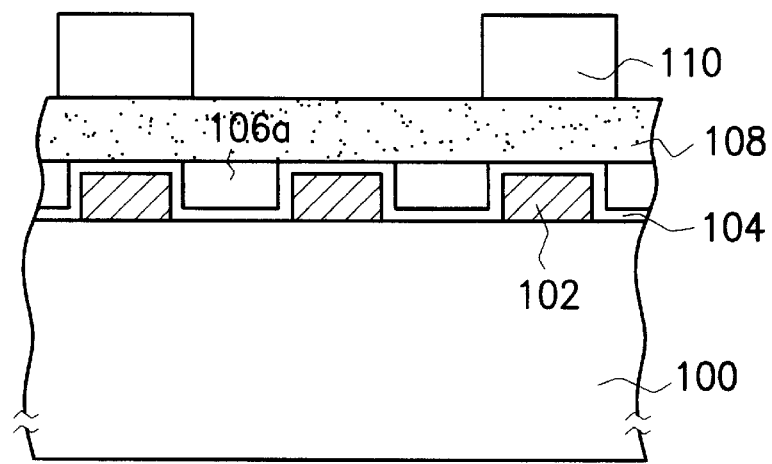

Referring to FIG. 1B, an anisotropic etching process, for example, reactive ion etching, is performed to remove the dielectric layer 106 above the metal lines 102, and leaving the dielectric layer 106a between the metal lines 102. Thereafter, a thermal conductivity layer 108 is formed over the substrate 100. A material for the thermal conductivity layer 108 has high thermal conductivity and a dielectric constant less than 4. The preferred thermal conductivity layer 108 is, for example, aluminum nitride formed by physical vapor deposition. A photoresist layer 110 used for defining the pattern of the thermal conductivity layer 108 is formed on the thermal conductivity layer 108.

Figure 1C:
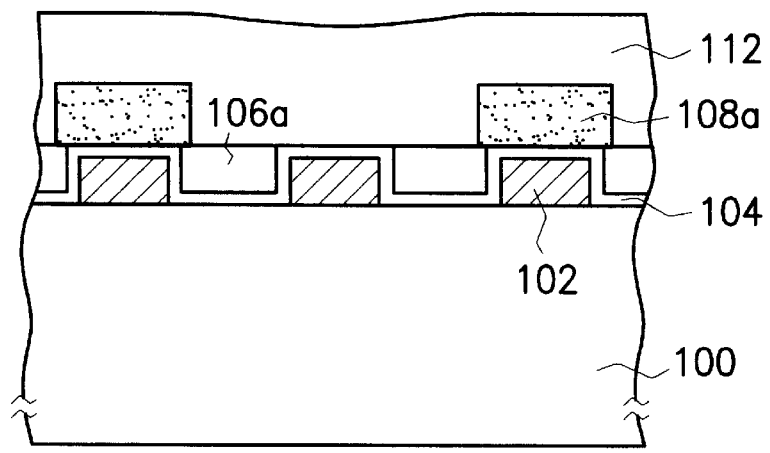

Referring to FIG. 1C, an anisotropic etching process, for example, reactive ion etching, is performed while using the photoresist layer 110 as a mask. A portion of the thermal conductivity layer 108 is etched, and the patterned thermal conductivity layer 108a is formed. The patterned thermal conductivity layer 108a is located on the surrounding of the predetermined region of the vias. The preferred shape of the patterned thermal conductivity layer 108a comprises a dummy line. The photoresist layer 110 is removed, and then another dielectric layer 112 is formed over the substrate 100. The dielectric layer 112 has a low dielectric constant, which is less than 3. A material of the dielectric layer 112 comprises spin-on organic material, for example, fluorinated polyimide (FPI), polyarylene ether (PAE), polymer or fluorinated poly (arylethers) (FLARE).

Figure 1D:
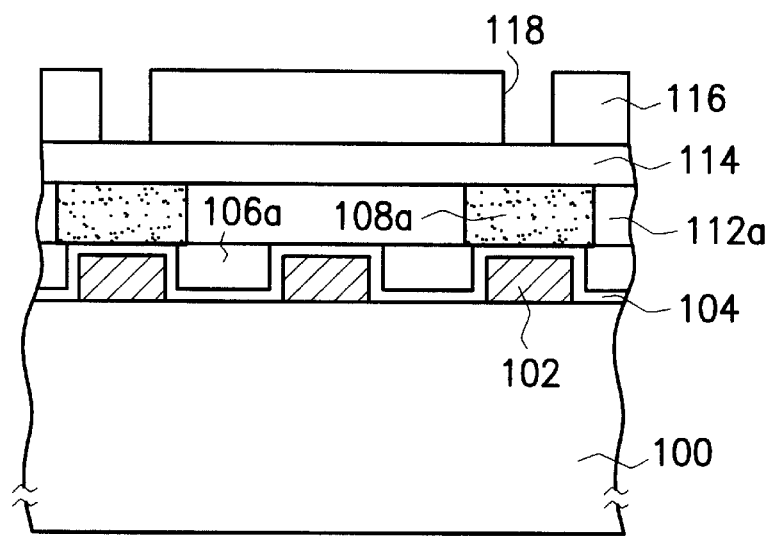

Referring to FIG. 1D, a portion of the dielectric layer 112 above the thermal conductivity layer 108a is removed by an anisotropic etching process, for example, reactive ion etching. The dielectric layer 112a between the patterned thermal conductivity layer 108a is remained. A cap layer 114 is formed over the substrate 100. A preferred material of the cap layer 114 comprises silicon oxide formed by, for example, chemical vapor deposition. The cap layer 114 is globally planarized by a chemical mechanical polishing process after the cap layer 114 is formed. A photoresist layer 116 used for defining the pattern of the via opening regions 118 is formed on the cap layer 114. The photoresist layer 116 is used for defining the cap layer 114, the patterned thermal conductivity layer 108a and the liner layer 104.

Figure 1E:
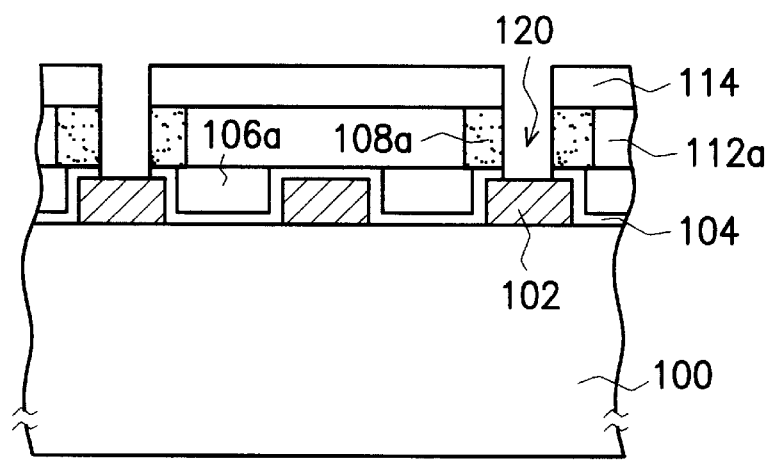

Referring to FIG. 1E, an anisotropic etching process using the photoresist layer 116 as a mask, for example reactive ion etching, is performed to remove the cap layer 114 exposed by the via opening regions 118 and the patterned underlying thermal conductivity layer 108a and the liner layer 104. Via openings 120 thus are formed, which expose the metal lines 102. Thereafter, the photoresist layer 116 is removed by oxygen plasma.

In the present invention, the inter-metal dielectric layer exposed by the via openings 120 is the cap layer 114, the patterned thermal conductivity layer 108a and the liner layer 104, which are not damaged by the oxygen plasma during the process of removing the photoresist layer 116. The organic dielectric layer with low dielectric constant 112a or 106a is not exposed to the oxygen plasma, so that a poisoned via is avoided during the following process of filling the via openings 120 with a metal layer.

Figure 1F:
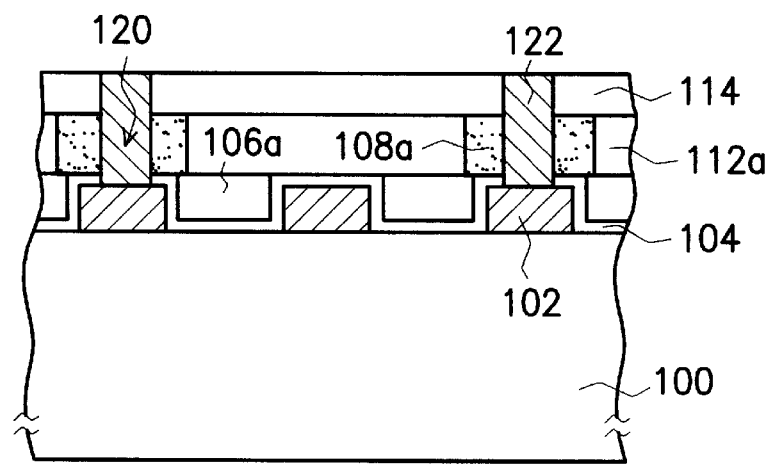

Referring to FIG. 1F, the via openings 120 are filled with a metal layer, for example, tungsten, to form vias 122. The vias 122 are formed by, for example, forming the metal material to cover the cap layer 114 and filling the via openings 120, and then etching back by reactive ion etching to leave the metal layer in the via openings 120.

In one preferred embodiment of the method of the present invention, an inter-metal dielectric layer comprises four layers, which includes the liner layer, the dielectric layer, the thermal conductivity layer and the cap layer. The material of the dielectric layers is an organic material with low dielectric constant, the material of the thermal conductivity layer is an inorganic material with low dielectric constant and high thermal conductivity.

Since the inter-metal dielectric layer is formed by a great number of low dielectric constant materials, the resistance-capacitance time delay effect is reduced and the performance of the device is improved.

The vias and the low dielectric constant organic dielectric layers with a are surrounded with the thermal conductivity layer, the cap layer formed with silicon oxide and the liner layer formed with silicon oxide. The organic dielectric layers with low dielectric constant are not exposed by the via openings. The inter-metal dielectric layer on the sidewalls of the via openings is not damaged while removing a photoresist layer used for defining the via openings by oxygen plasma. The issue a poisoned via is avoided while filling the via openings with metal material.

The thermal conductivity layer is patterned to form dummy lines which are located surrounding the predetermined regions of the vias. The thermal conductivity layer has high thermal conductivity, so that the heat produced by the metal lines under high speed operation can be diffused. Therefore, the present invention can avoid the reliability problem arising from using the organic dielectric material.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a interconnect, comprising the steps of:

providing a substrate having a plurality of metal lines formed thereon;

forming a liner layer over the substrate to cover the metal lines;

forming a first dielectric layer between the metal lines;

forming a plurality of patterned thermal conductivity layers over the substrate;

forming a second dielectric layer between the patterned thermal conductivity layers;

forming a cap layer over the substrate;

forming a plurality of via openings in the cap layer, the patterned thermal conductivity layers and the liner layer to expose the metal lines; and filling on the via openings with a metal layer to form a plurality of vias.

2. The method as claimed in claim 1, wherein materials of the first dielectric layer and the second dielectric layer comprise an organic dielectric layer with low dielectric constant.

3. The method as claimed in claim 1, wherein a dielectric constant of the patterned thermal conductivity layer is less than 4.

4. The method as claimed in claim 3, wherein a material of the patterned thermal conductivity layer comprises aluminum nitride.

5. The method as claimed in claim 1, wherein the patterned thermal conductivity layers are a dummy line.

6. The method as claimed in claim 1, wherein a material of the cap layer comprises silicon oxide.

7. A method of fabricating a interconnect, comprising the steps of:

providing a substrate having a plurality of metal lines formed thereon;

forming a liner layer over the substrate to cover the metal lines;

forming a first dielectric layer between the metal lines;

forming a plurality of patterned thermal conductivity layers with a dummy line form over the substrate;

forming a second dielectric layer between the patterned thermal conductivity layers with the dummy line form;

forming a cap layer over the substrate;

forming a plurality of via openings in the cap layer, the patterned thermal conductivity layers and the liner layer to expose the metal lines; and filling the via openings with a metal layer to form a plurality of vias.

8. The method as claimed in claim 7, wherein materials of the first dielectric layer and the second dielectric layer comprise an organic dielectric layer with low dielectric constant.

9. The method as claimed in claim 7, wherein a dielectric constant of the patterned thermal conductivity layer is less than 4.

10. The method as claimed in claim 9, wherein a material of the patterned thermal conductivity layer comprises aluminum nitride.

11. The method as claimed in claim 7, wherein a material of the cap layer comprises silicon oxide.

12. A method of fabricating a interconnect, comprising the steps of:

providing a substrate having a plurality of metal lines formed thereon;

forming a liner layer over the substrate to cover the metal lines;

forming a first dielectric layer on the liner layer, wherein the first dielectric layer has a low dielectric constant;

removing a part of the first dielectric layer to leave the first dielectric layer between the metal lines;

forming a thermal conductivity layer over the substrate;

patterning the thermal conductivity layer to form a plurality of dummy lines;

forming a second dielectric layer over the substrate, wherein the second dielectric layer has a low dielectric constant;

removing a part of the second dielectric layer to leaving the second dielectric layer between the dummy lines;

forming a cap layer over the cap layer;

forming a photoresist over the substrate;

performing an etching process using the photoresist as a mask to form a plurality of via openings in the cap layer, the dummy lines and the liner layer to expose the metal lines;

removing the photoresist; and filling the via openings with a metal layer to form a plurality of vias.

13. The method as claimed in claim 12, wherein a dielectric constant of the thermal conductivity layer is less than 4.

14. The method as claimed in claim 13, wherein a material of the thermal conductivity layer comprises aluminum nitride.

15. The method as claimed in claim 12, wherein the step of removing part of the first dielectric layer comprises reactive ion etching.

16. The method as claimed in claim 12, wherein the step of removing part of the second dielectric layer comprises reactive ion etching.

17. The method as claimed in claim 12, wherein a material of the cap layer comprises silicon oxide.

18. The method as claimed in claim 12, furthermore comprising the step of a chemical mechanic polishing process before the photoresist layer is formed and after the cap layer is formed over the substrate.

* * * * *